(12) United States Patent
Lee

(10) Patent No.: US 8,624,664 B2
(45) Date of Patent: Jan. 7, 2014

(54) FUSE CIRCUIT

(75) Inventor: Sang Kwon Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/570,400

(22) Filed: Aug. 9, 2012

(65) Prior Publication Data

US 2013/0147542 A1 Jun. 13, 2013

(30) Foreign Application Priority Data

Dec. 9, 2011 (KR) .................. 10-2011-0131651

(51) Int. Cl.
*H01H 37/76* (2006.01)
*H01H 85/00* (2006.01)

(52) U.S. Cl.
USPC ...................................... 327/525; 365/225.7

(58) Field of Classification Search
USPC .................................. 327/525–526; 365/225.7
See application file for complete search history.

(56) References Cited

U.S. PATENT DOCUMENTS

| 7,154,800 B2 * | 12/2006 | Imondi | 365/225.7 |
| 7,184,331 B2 * | 2/2007 | Kim et al. | 365/200 |
| 7,535,780 B2 * | 5/2009 | Lee | 365/200 |

FOREIGN PATENT DOCUMENTS

KR         100463207 B1    12/2004

* cited by examiner

*Primary Examiner* — Quan Tra
(74) *Attorney, Agent, or Firm* — William Park & Associates Patent Ltd.

(57) ABSTRACT

A fuse circuit includes a programming fuse signal generation block configured to generate parity signals, logic levels of which are determined according to addresses selected among a plurality of addresses with a programming enable signal enabled, and generate programming fuse signals which are programmed in response to the programming enable signal, the plurality of addresses and the parity signals; a corrected pulse generation block configured to correct an error included in the programming fuse signals and generate corrected pulses; and a fuse unit configured to generate fuse signals which are reprogrammed according to the corrected pulses.

20 Claims, 9 Drawing Sheets

FIG.9

| | Bit Format | Pulse | Programming Fuse Signal | Information Signal | | | |
|---|---|---|---|---|---|---|---|
| | | | | IP<4> | IP<3> | IP<2> | IP<1> |
| 1 | PA<1> | PUL<9> | PFUSE<9> | 0 | 0 | 0 | 1 |
| 2 | PA<2> | PUL<10> | PFUSE<10> | 0 | 0 | 1 | 0 |
| 3 | PGMEN | PUL<1> | PFUSE<1> | 0 | 0 | 1 | 1 |
| 4 | PA<3> | PUL<11> | PFUSE<11> | 0 | 1 | 0 | 0 |
| 5 | ADD<1> | PUL<2> | PFUSE<2> | 0 | 1 | 0 | 1 |
| 6 | ADD<2> | PUL<3> | PFUSE<3> | 0 | 1 | 1 | 0 |
| 7 | ADD<3> | PUL<4> | PFUSE<4> | 0 | 1 | 1 | 1 |
| 8 | PA<4> | PUL<12> | PFUSE<12> | 1 | 0 | 0 | 0 |
| 9 | ADD<4> | PUL<5> | PFUSE<5> | 1 | 0 | 0 | 1 |
| 10 | ADD<5> | PUL<6> | PFUSE<6> | 1 | 0 | 1 | 0 |
| 11 | ADD<6> | PUL<7> | PFUSE<7> | 1 | 0 | 1 | 1 |
| 12 | ADD<7> | PUL<8> | PFUSE<8> | 1 | 1 | 0 | 0 |

FUSE CIRCUIT

CROSS-REFERENCES TO RELATED APPLICATIONS

The present application claims priority under 35 U.S.C 119(a) to Korean Patent Application No. 10-2011-0131651, filed on Dec. 9, 2011, in the Korean Intellectual Property Office, which is incorporated herein by reference in its entirety as set forth in full.

BACKGROUND

1. Field of the Invention

Example embodiments relate to a fuse circuit, and more particularly a fuse circuit configured to correct errors that occur when programming the fuse circuit and normally generate a fuse signal.

2. Description of the Related Art

Integrated circuits typically include a fuse circuit which includes a fuse capable of being programmed to change an internal setting without changing a design. Electrical connection characteristics of the fuse used in the fuse circuit is changed when a laser beam or an electrical stress is applied to the fuse, and information regarding internal settings of the integrated circuit is programmed using such a change in the electrical connection state of the fuse.

Fuse programming methods are divided into a method of disconnecting the connection state of a fuse using a laser beam, and a method of changing the electrical connection state of a fuse by applying an electrical stress. Fuses programmed using electrical stress (an electrical way) are divided into an anti-type fuse in which electrical connection state is changed from an open state to a short state, and a blowing type fuse in which an electrical connection state is changed from a short state to an open state.

FIG. 1 is a block diagram showing a configuration of a conventional fuse circuit.

Referring to FIG. 1, the conventional fuse circuit includes a programming pulse generation unit 8 configured to receive a programming enable signal PGMEN and first to seventh addresses ADD<1:7> and generate first to eighth pulses P<1:8>, and a fuse unit 9 including first to eighth fuse sections 9(1:8) configured to be programmed in response to the first to eighth pulses P<1:8> and generate first to eighth fuse signals FUSE<1:8>. The first to eighth fuse sections 9(1:8) are realized as fuses which are programmed in an electrical way in response to the first to eighth pulses P<1:8>.

In the fuse circuit configured in this way, the first to eighth fuse sections 9(1:8) are programmed according to the programming enable signal PGMEN and the first to seventh addresses ADD<1:7> and generate the first to eighth fuse signals FUSE<1:8>. For example, assuming that the first to third addresses ADD<1:3> are inputted at a logic high level and the fourth to seventh addresses ADD<4:7> are inputted at a logic low level in a state in which the programming enable signal PGMEN is enabled to a logic high level, the programming pulse generation unit 8 generates the first to fourth pulses P<1:4> of a logic high level and the fifth to eighth pulses P<5:8> of a logic low level. The first to fourth fuse sections 9(1:4) are changed in their electrical connection states according to the programming enable signal PGMEN of the logic high level and the first to third addresses ADD<1:3> of the logic high level and generate the first to fourth fuse signals FUSE<1:4> of a logic high level, and the fifth to eighth fuse sections 9(5:8) generate the fifth to eighth fuse signals FUSE<5:8> of a logic low level.

However, when a fail occurs, for example in the gate dielectric layer in the fifth fuse section 9(5) included in the fuse unit 9, the fifth fuse section 9(5) erroneously generates the fifth fuse signal FUSE<5> at a logic high level instead of the logic low level. As a consequence, an error may occur in the operation of the integrated circuit.

SUMMARY

An embodiment of the present invention relates to a fuse circuit which can perform corrections even when an error occurs in a fuse and can generate a normally programmed fuse signal, thereby preventing the occurrence of an operation error in an integrated circuit.

In one embodiment, a fuse circuit includes: a programming fuse signal generation block configured to generate parity signals, logic levels of which are determined according to addresses selected among a plurality of addresses with a programming enable signal enabled, and generate programming fuse signals which are programmed in response to the programming enable signal, the plurality of addresses and the parity signals; a corrected pulse generation block configured to correct an error included in the programming fuse signals and generate corrected pulses; and a fuse unit configured to generate fuse signals which are reprogrammed according to the corrected pulses.

In another embodiment, a fuse circuit includes: a parity signal generation unit configured to generate parity signals in response to a programming enable signal and a plurality of addresses; a pulse generation unit configured to generate pulses in response to the programming enable signal, the plurality of addresses and the parity signals; a preliminary fuse unit including fuses of which electrical connection states are changed in response to the pulses, and configured to generate programming fuse signals; a corrected pulse generation block configured to correct an error included in the programming fuse signals and generate corrected pulses; and a fuse unit configured to generate fuse signals which are reprogrammed in response to the corrected pulses.

BRIEF DESCRIPTION OF THE DRAWINGS

The above and other aspects, features and other advantages will be more clearly understood from the following detailed description taken in conjunction with the accompanying drawings, in which:

FIG. 9 is a table explaining operations of the fuse circuit shown in FIG. 2.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
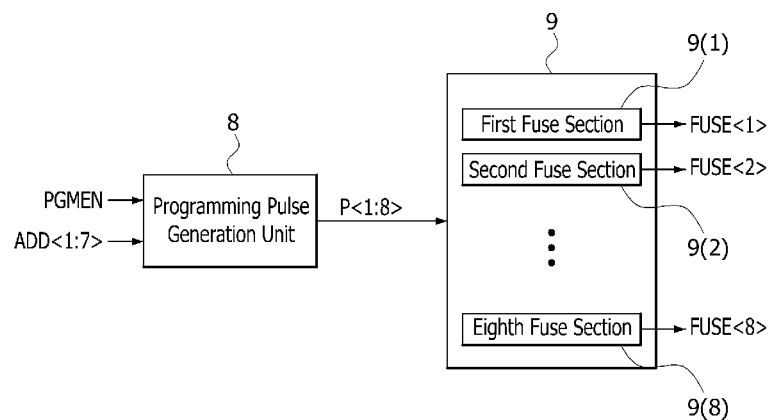
FIG. 1 is a block diagram showing a configuration of a conventional fuse circuit.
Figure 2:
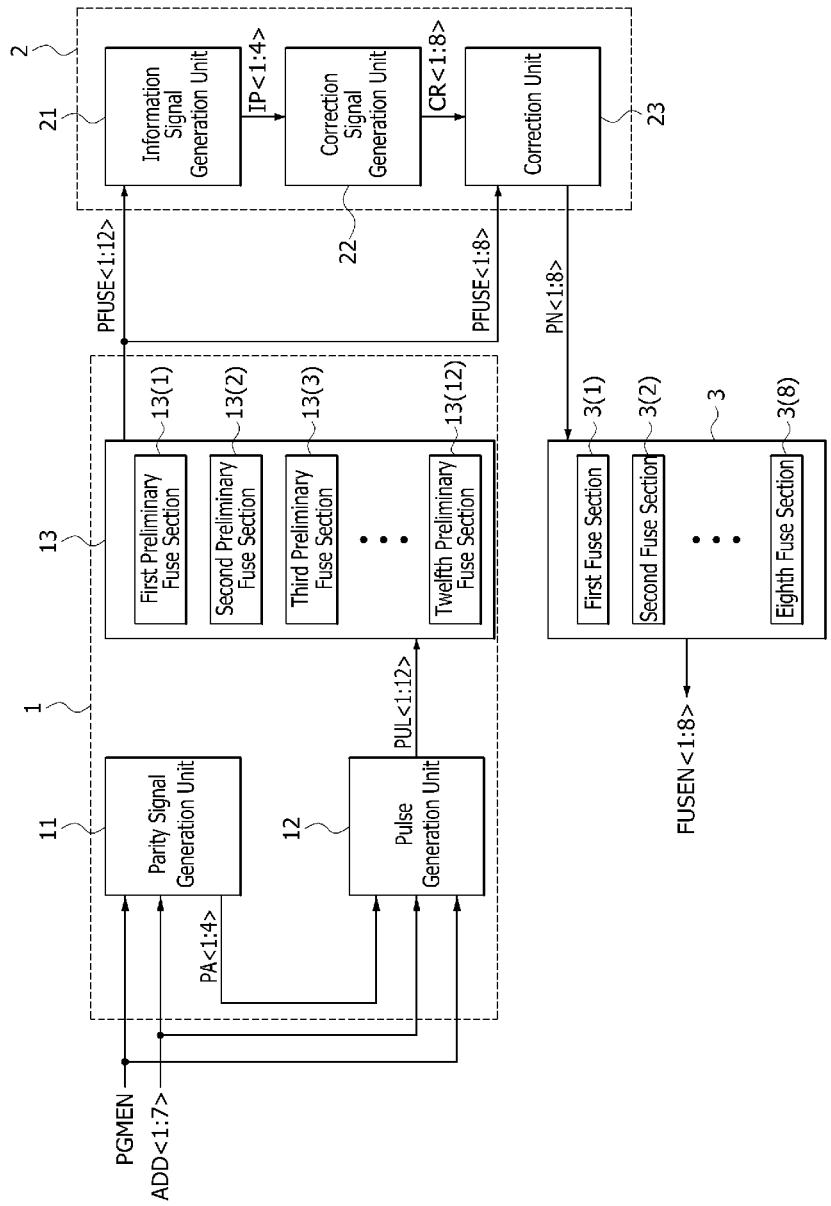
FIG. 2 is a block diagram showing a configuration of a fuse circuit in accordance with an embodiment of the present invention.

FIG. 2 is a block diagram showing a configuration of a fuse circuit in accordance with an embodiment of the present invention.

Referring to FIG. 2, the fuse circuit in accordance with an embodiment includes a programming fuse signal generation block 1, a corrected pulse generation block 2, and a fuse unit 3. The programming fuse signal generation block 1 includes a parity signal generation unit 11, a pulse generation unit 12 and a preliminary fuse unit 13. The corrected pulse generation block 2 includes an information signal generation unit 21, a correction signal generation unit 22 and a correction unit 23.

The parity signal generation unit 11 is configured to generate first to fourth parity signals PA<1:4> logic levels of which are determined by addresses selected among first to seventh addresses ADD<1:7> when a programming enable signal PGMEN is enabled to a logic high level. A configuration and operation of the parity signal generation unit 11 will be described later with reference to FIG. 3.

The pulse generation unit 12 is configured to generate first to twelfth pulses PUL<1:12> which are sequentially produced in response to the programming enable signal PGMEN, the first to seventh addresses ADD<1:7> and the first to fourth parity signals PA<1:4>. A configuration and operation of the pulse generation unit 12 will be described later with reference to FIGS. 4 and 5.

The preliminary fuse unit 13 includes first to twelfth preliminary fuse sections 13(1:12) having fuses which are respectively changed in their electrical connection states when electrical stresses are inputted. The first to twelfth preliminary fuse sections 13(1:12) are configured to generate first to twelfth programming fuse signals PFUSE<1:12> which are programmed in response to the first to twelfth pulses PUL<1:12>. For example, if the first to fourth pulses PUL<1:4> among the first to twelfth pulses PUL<1:12> are inputted as enabled, connection states of the fuses included in the first to fourth preliminary fuse sections 13(1:4) are changed, and the first to fourth programming fuse signals PFUSE<1:4> are programmed to a logic high level. The fifth to twelfth programming fuse signals PFUSE<5:12> are programmed to a logic low level.

The information signal generation unit 21 is configured to generate first to fourth information signals IP<1:4> according to the levels of the first to twelfth programming fuse signals PFUSE<1:12>. The first to fourth information signals IP<1:4> include information regarding programming fuse signals in which errors have occurred, among the first to twelfth programming fuse signals PFUSE<1:12>. A configuration and operation of the information signal generation unit 21 will be described later with reference to FIG. 6.

The correction signal generation unit 22 is configured to decode the first to fourth information signals IP<1:4> and generate first to eighth correction signals CR<1:8> for correcting an error that may have occurred in the first to eighth programming fuse signals PFUSE<1:8>. A configuration and operation of the correction signal generation unit 22 will be described later with reference to FIG. 7.

The correction unit 23 is configured to buffer, or invert and buffer the first to eighth programming fuse signals PFUSE<1:8> in response to the first to eighth correction signals CR<1:8>, and output first to eighth corrected pulses PN<1:8>. A configuration and operation of the correction unit 23 will be described later with reference to FIG. 8.

The fuse unit 3 includes first to eighth fuse sections 3(1:8) having fuses which are respectively changed in their electrical connection states when electrical stresses are inputted. The first to eighth fuse sections 3(1:8) are configured to generate first to eighth fuse signals FUSEN<1:8> which are programmed in response to the first to eighth corrected pulses PN<1:8>. For example, if only the first to fourth corrected pulses PN<1:4> among the first to eighth corrected pulses PN<1:8> are inputted as enabled, the connection states of the fuses included in the first to fourth fuse sections 3(1:4) are changed, and the first to fourth fuse signals FUSEN<1:4> are programmed to a logic high level. The fifth to eighth fuse signals FUSEN<5:8>, however, are programmed to a logic low level.

Figure 3:
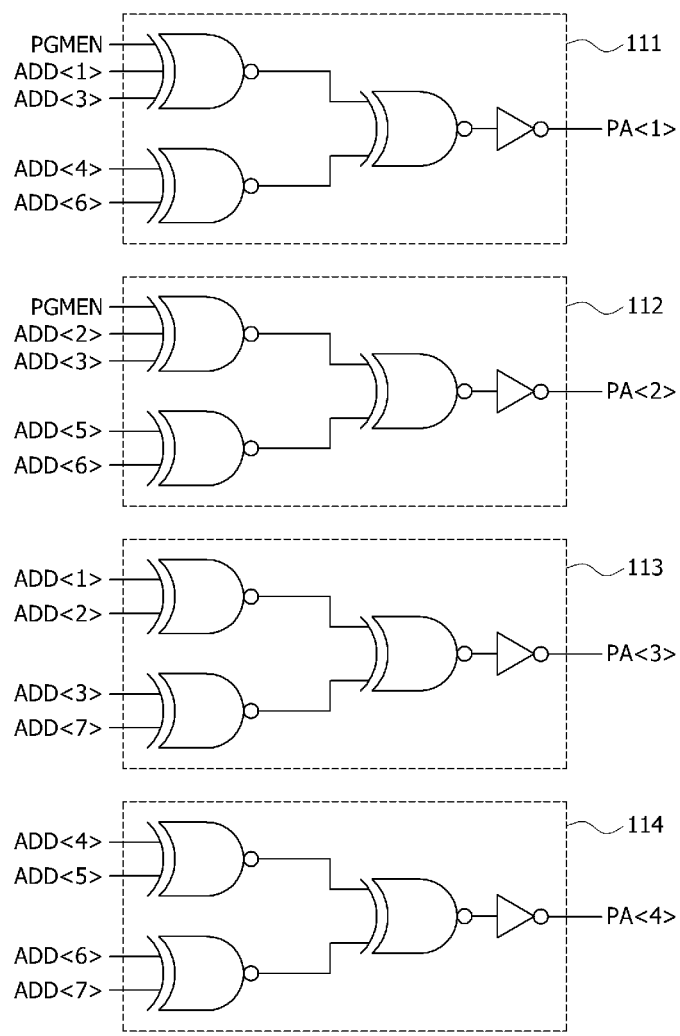
FIG. 3 is a circuit diagram showing an example embodiment of a parity signal generation unit included in the fuse circuit shown in FIG. 2.

FIG. 3 is a circuit diagram showing an example embodiment of the parity signal generation unit 11.

Referring to FIG. 3, the parity signal generation unit 11 includes first to fourth parity signal generating sections 111 to 114. The first parity signal generating section 111 is configured to generate the first parity signal PA<1> of a logic high level when the number of signals with logic high levels among a first group of signals including the programming enable signal PGMEN, the first address ADD<1>, the third address ADD<3>, the fourth address ADD<4> and the sixth address ADD<6> is odd, and generate the first parity signal PA<1> of a logic low level when the number of signals among the first group of signals with logic high levels is even. The second parity signal generating section 112 is configured to generate the second parity signal PA<2> of a logic high level when the number of signals with logic high levels among a second group of signals including the programming enable signal PGMEN, the second address ADD<2>, the third address ADD<3>, the fifth address ADD<5> and the sixth address ADD<6> is odd, and generate the second parity signal PA<2> of a logic low level when the number of signals among the second group of signals with logic high levels is even. The third parity signal generating section 113 is configured to generate the third parity signal PA<3> of a logic high level when the number of signals with logic high levels among a third group of signals including the first address ADD<1>, the second address ADD<2>, the third address ADD<3> and the seventh address ADD<7> is odd, and generate the third parity signal PA<3> of a logic low level when the number of signals among the third group of signals with logic high levels is even. The fourth parity signal generating section 114 is configured to generate the fourth parity signal PA<4> of a logic high level when the number of signals with logic high levels among a fourth group of signals including the fourth address ADD<4>, the fifth address ADD<5>, the sixth address ADD<6> and the seventh address ADD<7> is odd, and generate the fourth parity signal PA<4> of a logic low level when the number of signals among the fourth group of signals with logic high levels is even. The logic levels of the first to fourth parity signals PA<1:4> may be set in a variety of ways according to different embodiments.

Figure 4:
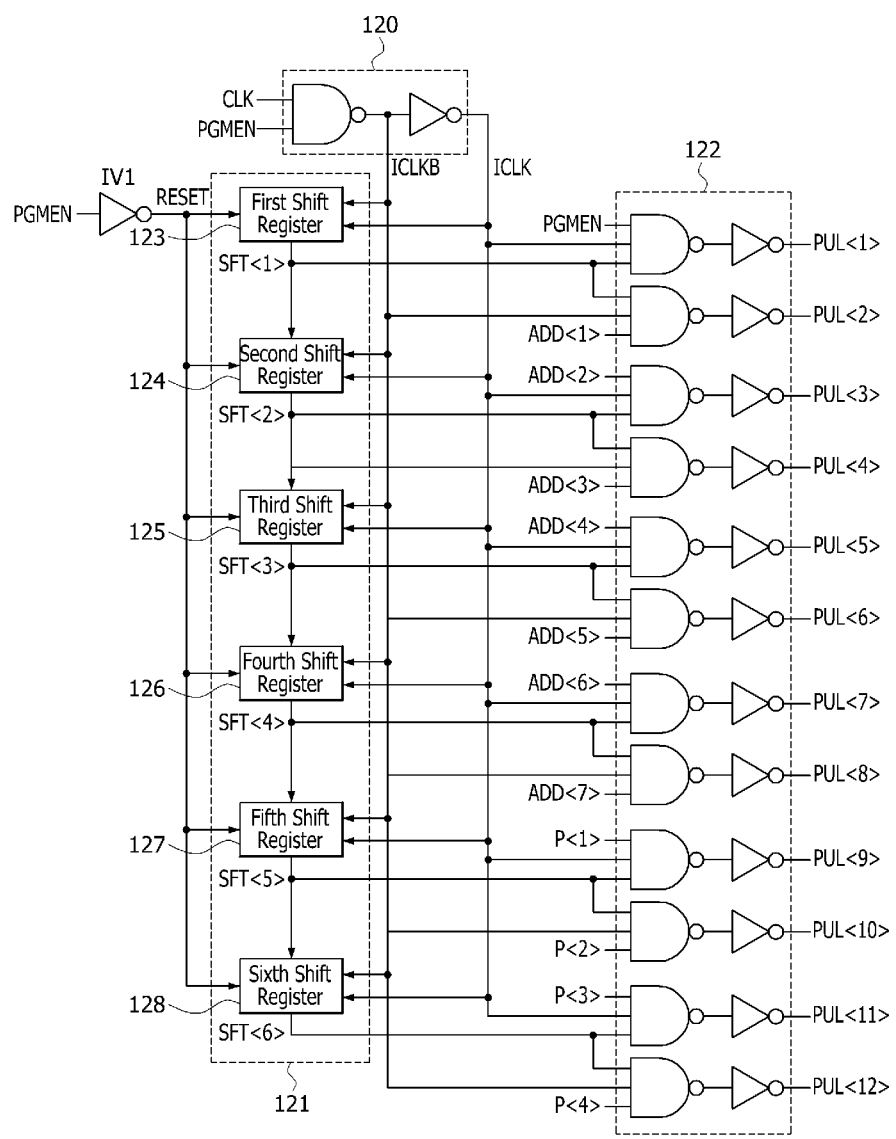
FIG. 4 is a circuit diagram showing an example embodiment of a pulse generation unit included in the fuse circuit shown in FIG. 2.
Figure 5:
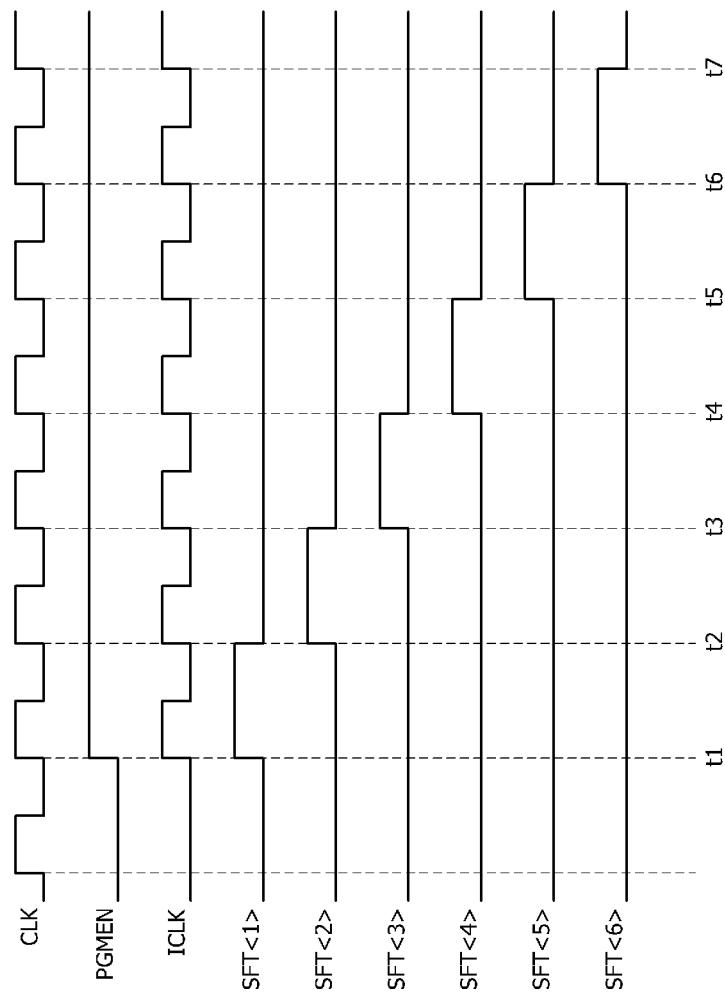
FIG. 5 is a timing diagram explaining operations of the pulse generation unit shown in FIG. 4.

FIG. 4 is a circuit diagram showing an example embodiment of the pulse generation unit 12, and FIG. 5 is a timing diagram explaining operations of the pulse generation unit 12.

Referring to FIG. 4, the pulse generation unit 12 includes an inverter IV1, an internal clock generating section 120, a shifting signal generating section 121, and a buffer section 122. The inverter IV1 is configured to invert and buffer the programming enable signal PGMEN and generate a reset signal RESET. The internal clock generating section 120 is configured to buffer a clock signal CLK in response to the programming enable signal PGMEN and generate an internal clock ICLK and an inverted internal clock ICLKB. The shifting signal generating section 121 is configured to generate first to sixth shifting signals SFT<1:6> which are sequentially enabled according to the internal clock ICLK, and the shifting signal generating section 121 is configured to generate the inverted internal clock ICLKB. The buffer section 122 is configured to buffer the programming enable signal PGMEN, the first to seventh addresses ADD<1:7> and the first to fourth parity signals PA<1:4> in synchronization with the internal clock ICLK and the inverted internal clock ICLKB during periods in which the first to sixth shifting signals SFT<1:6> are enabled, and generate the first to twelfth pulses PUL<1:12>. The shifting signal generation section 121 includes first to sixth shift registers 123 to 128 which are reset when the reset signal RESET of a logic high level is inputted and which generates the first to sixth shifting signals SFT<1:6> sequentially enabled by being shifted by one cycle of the clock signal CLK during a period in which the programming enable signal PGMEN has a logic high level.

Referring to FIG. 5, if the programming enable signal PGMEN is enabled to the logic high level at a time t1, the first shifting signal SFT<1> is enabled to a logic high level during a period t1 to t2, the second shifting signal SFT<2> is enabled to a logic high level during a period t2 to t3, the third shifting signal SFT<3> is enabled to a logic high level during a period t3 to t4, the fourth shifting signal SFT<4> is enabled to a logic high level during a period t4 to t5, the fifth shifting signal SFT<5> is enabled to a logic high level during a period t5 to t6, and the sixth shifting signal SFT<6> is enabled to a logic high level during a period t6 to t7. During the period t1 to t2 in which the first shifting signal SFT<1> is enabled, the programming enable signal PGMEN is buffered in synchronization with the rising edge of the internal clock ICLK and is outputted as the first pulse PUL<1>, and the first address ADD<1> is buffered in synchronization with the falling edge of the internal clock ICLK and is outputted as the second pulse PUL<2>. During the period t2 to t3, the second address ADD<2> is buffered and is outputted as the third pulse PUL<3>, and the third address ADD<3> is buffered and is outputted as the fourth pulse PUL<4>. During the period t3 to t4, the fourth address ADD<4> is buffered and is outputted as the fifth pulse PUL<5>, and the fifth address ADD<5> is buffered and is outputted as the sixth pulse PUL<6>. During the period t4 to t5, the sixth address ADD<6> is buffered and is outputted as the seventh pulse PUL<7>, and the seventh address ADD<7> is buffered and is outputted as the eighth pulse PUL<8>. During the period t5 to t6, the first parity signal PA<1> is buffered and is outputted as the ninth pulse PUL<9>, and the second parity signal PA<2> is buffered and is outputted as the tenth pulse PUL<10>. During the period t6 to t7, the third parity signal PA<3> is buffered and is outputted as the eleventh pulse PUL<11>, and the fourth parity signal PA<4> is buffered and is outputted as the twelfth pulse PUL<12>.

Figure 6:
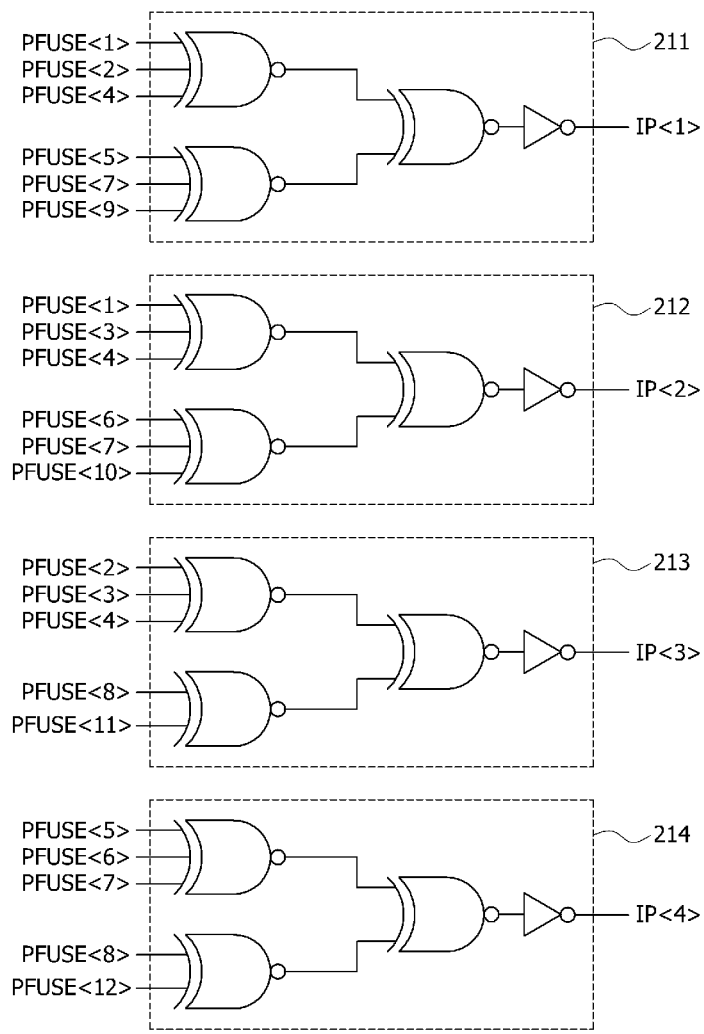
FIG. 6 is a circuit diagram showing an example embodiment of an information signal generation unit included in the fuse circuit shown in FIG. 2.

FIG. 6 is a circuit diagram showing an example embodiment of the information signal generation unit 21.

Referring to FIG. 6, the information signal generation unit 21 includes first to fourth information signal generating sections 211 to 214. The first information signal generating section 211 is configured to generate the first information signal IP<1> of a logic high level when the number of signals with logic high levels among a first group of programming fuse signals including the first programming fuse signal PFUSE<1>, the second programming fuse signal PFUSE<2>, the fourth programming fuse signal PFUSE<4>, the fifth programming fuse signal PFUSE<5>, the seventh programming fuse signal PFUSE<7> and the ninth programming fuse signal PFUSE<9> is odd, and generate the first information signal IP<1> of a logic low level when the number of signals among the first group of programming fuse signals with logic high levels is even. The second information signal generating section 212 is configured to generate the second information signal IP<2> of a logic high level when the number of signals with logic high levels among a second group of programming fuse signals including the first programming fuse signal PFUSE<1>, the third programming fuse signal PFUSE<3>, the fourth programming fuse signal PFUSE<4>, the sixth programming fuse signal PFUSE<6>, the seventh programming fuse signal PFUSE<7> and the tenth programming fuse signal PFUSE<10> is odd, and generate the second information signal IP<2> of a logic low level when the number of signals among the second group of programming fuse signals with logic high levels is even. The third information signal generating section 213 is configured to generate the third information signal IP<3> of a logic high level when the number of signals with logic high levels among a third group of programming fuse signals including the second programming fuse signal PFUSE<2>, the third programming fuse signal PFUSE<3>, the fourth programming fuse signal PFUSE<4>, the eighth programming fuse signal PFUSE<8> and the eleventh programming fuse signal PFUSE<11> is odd, and generate the third information signal IP<3> of a logic low level when the number of signals among the third group of programming fuse signals with logic high levels is even. The fourth information signal generating section 214 is configured to generate the fourth information signal IP<4> of a logic high level when the number of signals with logic high levels among a fourth group of programming fuse signals including the fifth programming fuse signal PFUSE<5>, the sixth programming fuse signal PFUSE<6>, the seventh programming fuse signal PFUSE<7>, the eighth programming fuse signal PFUSE<8> and the twelfth programming fuse signal PFUSE<12> is odd, and generate the fourth information signal IP<4> of a logic low level when the number of signals among the fourth group of programming fuse signals with logic high levels is even. The logic levels of the first to fourth information signals IP<1:4> may be set in a variety of ways according to various embodiments.

Figure 7:
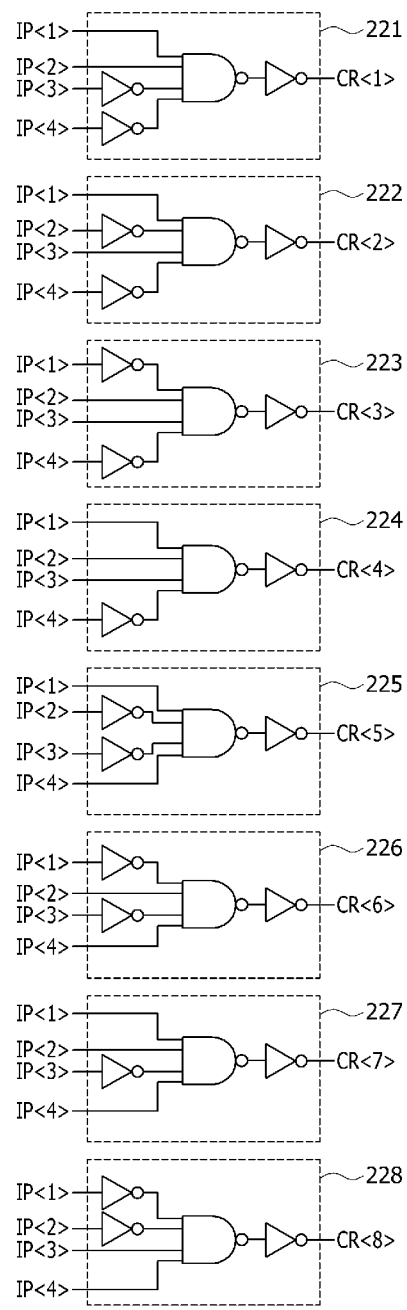
FIG. 7 is a circuit diagram showing an example embodiment of a correction signal generation unit included in the fuse circuit shown in FIG. 2.

FIG. 7 is a circuit diagram showing an example embodiment of the correction signal generation unit 22.

Referring to FIG. 7, the correction signal generation unit 22 includes first to eighth correction signal generating sections 221 to 228 which are configured to decode the first to fourth information signals IP<1:4> and generate the first to eighth correction signals CR<1:8> which are selectively enabled to a logic high level. For example, when the first information signal IP<1> and the third information signal IP<3> have the logic high level and the second information signal IP<2> and the fourth information signal IP<4> have the logic low level, only the second correction signal CR<2> among the first to eighth correction signals CR<1:8> is generated to the logic high level.

Figure 8:
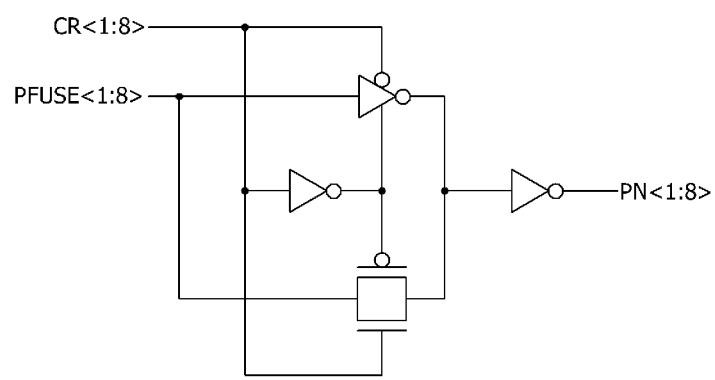
FIG. 8 is a circuit diagram showing an example embodiment of a correction unit included in the fuse circuit shown in FIG. 2.

FIG. 8 is a circuit diagram showing an example embodiment of the correction unit 23.

Referring to FIG. 8, the correction unit 23 inverts and buffers (inversion-buffers) the first to eighth programming fuse signals PFUSE<1:8> and outputs the first to eighth corrected pulses PN<1:8> when the first to eighth correction signals CR<1:8> have the logic high level, and buffers the first to eighth programming fuse signals PFUSE<1:8> and outputs the first to eighth corrected pulses PN<1:8> when the first to eighth correction signals CR<1:8> have the logic low level. For example, when only the second correction signal CR<2> among the first to eighth correction signals CR<1:8> has the logic high level, the correction unit 23 inversion-buffers the second programming fuse signal PFUSE<2> and outputs the second corrected pulse PN<2>, and buffers the first programming fuse signal PFUSE<1> and the third to eighth programming fuse signals PFUSE<3:8> and outputs the first corrected pulse PN<1> and the third to eighth corrected pulses PN<3:8>.

The fuse circuit configured as described above traces and corrects an error which has occurred in the first to eighth programming fuse signals PFUSE<1:8>, by using a hamming code. Referring to FIG. 9, there is shown an error correction method for the first to eighth programming fuse signals PFUSE<1:8> according to combinations of bit formats among the first to fourth parity signals PA<1:4>, the programming enable signal PGMEN and the first to seventh addresses ADD<1:7> and the logic levels of the first to fourth information signals IP<1:4>. That is to say, when a fail occurs, for example, in the fourth preliminary fuse section 13(4) among the first to eighth preliminary fuse sections 13(1:8) and the fourth programming fuse signal PFUSE<4> is generated to the logic low level instead of the logic high level, the first to fourth information signals IP<1:4> are generated as '0, 1, 1, 1'. '0, 1, 1, 1' means that the fourth information signal IP<4> has the logic low level and the first to third information signals IP<1:3> have the logic high level. The correction signal generation unit 22 generates the fourth correction signal CR<4> with the logic high level when the first to fourth information signals IP<1:4> are generated as '0, 1, 1, 1', and the correction unit 23 inversion-buffers the fourth programming fuse signal PFUSE<4> and generates the fourth corrected pulse PN<4> of the logic high level. Accordingly, the fuse unit 3 receives the fourth corrected pulse PN<4> of the logic high level and reprograms the fourth fuse signal FUSEN<4> to a logic high level.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A fuse circuit comprising:
   a programming fuse signal generation block configured to generate parity signals, logic levels of which are determined according to addresses selected among a plurality of addresses with a programming enable signal enabled, and generate programming fuse signals which are programmed in response to the programming enable signal, the plurality of addresses and the parity signals;
   a corrected pulse generation block configured to correct an error included in the programming fuse signals and generate corrected pulses; and
   a fuse unit configured to generate fuse signals which are reprogrammed according to the corrected pulses.

2. The fuse circuit according to claim 1, wherein the programming fuse signal generation block comprises:
   a parity signal generation unit configured to generate the parity signals in response to the programming enable signal and the plurality of addresses;
   a pulse generation unit configured to generate pulses in response to the programming enable signal, the plurality of addresses and the parity signals; and
   a preliminary fuse unit including fuses which are changed in their electrical connection states in response to the pulses, and configured to generate the programming fuse signals.

3. The fuse circuit according to claim 2, wherein the corrected pulse generation block comprises:
   an information signal generation unit configured to generate information signals which include information regarding an error included in the programming fuse signals;
   a correction signal generation unit configured to generate correction signals in response to the information signals; and
   a correction unit configured to correct the error included in the programming fuse signals in response to the correction signals, and generate corrected pulses.

4. The fuse circuit according to claim 3, wherein the parity signal generation unit generates,
   a first parity signal, a logic level of which is determined according to the programming enable signal and first, third, fourth and sixth addresses,
   a second parity signal, a logic level of which is determined according to the programming enable signal and second, third, fifth and sixth addresses,
   a third parity signal, a logic level of which is determined according to first, second, third and seventh addresses, and
   a fourth parity signal, a logic level of which is determined according to fourth, fifth, sixth and seventh addresses.

5. The fuse circuit according to claim 4, wherein the pulse generation unit buffers the programming enable signal, the first to seventh addresses and the first to fourth parity signals in synchronization with shifting signals which are sequentially generated, and outputs first to twelfth pulses.

6. The fuse circuit according to claim 5, wherein the pulse generation unit comprises:
   a shifting signal generating section configured to generate first to sixth shifting signals which are sequentially enabled according to the programming enable signal and a clock signal; and
   a buffer section configured to buffer the programming enable signal, the first to seventh addresses and the first to fourth parity signals in response to clock signal and the first to sixth shifting signals, and generate the first to twelfth pulses.

7. The fuse circuit according to claim 5, wherein the preliminary fuse unit includes first to twelfth preliminary fuse sections which respectively include fuses that are configured to generate first to twelfth programming fuse signals in response to the first to twelfth pulses.

8. The fuse circuit according to claim 7, wherein the information signal generation unit generates,
   a first information signal, a logic level of which is determined according to the first, second, fourth, fifth, seventh and ninth programming fuse signals,
   a second information signal, a logic level of which is determined according to the first, third, fourth, sixth, seventh and tenth programming fuse signals,
   a third information signal, a logic level of which is determined according to the second, third, fourth, eighth and eleventh programming fuse signals, and
   a fourth information signal, a logic level of which is determined according to the fifth, sixth, seventh, eighth and twelfth programming fuse signals.

9. The fuse circuit according to claim 8, wherein the correction signal generation unit decodes the first to fourth information signals and generates first to eighth correction signals.

10. The fuse circuit according to claim 9, wherein the correction unit buffers or inversion-buffers the first to eighth programming fuse signals in response to the first to eighth correction signals and transfers first to eighth corrected pulses.

11. The fuse circuit according to claim 10, wherein the fuse unit includes first to eighth fuse sections which respectively include fuses and are configured to generate first to eighth fuse signals in response to the first to eighth corrected pulses.

12. A fuse circuit comprising:
a parity signal generation unit configured to generate parity signals in response to a programming enable signal and a plurality of addresses;
a pulse generation unit configured to generate pulses in response to the programming enable signal, the plurality of addresses and the parity signals;
a preliminary fuse unit including fuses of which electrical connection states are changed in response to the pulses, and configured to generate programming fuse signals;
a corrected pulse generation block configured to correct an error included in the programming fuse signals and generate corrected pulses; and
a fuse unit configured to generate fuse signals which are reprogrammed in response to the corrected pulses.

13. The fuse circuit according to claim 12, wherein the parity signal generation unit generates,
a first parity signal, a logic level of which is determined according to the programming enable signal and first, third, fourth and sixth addresses,
a second parity signal, a logic level of which is determined according to the programming enable signal and second, third, fifth and sixth addresses,
a third parity signal, a logic level of which is determined according to first, second, third and seventh addresses, and
a fourth parity signal, a logic level of which is determined according to fourth, fifth, sixth and seventh addresses.

14. The fuse circuit according to claim 13, wherein the pulse generation unit buffers the programming enable signal, the first to seventh addresses and the first to fourth parity signals in synchronization with shifting signals which are sequentially generated, and outputs first to twelfth pulses.

15. The fuse circuit according to claim 14, wherein the pulse generation unit comprises:
a shifting signal generating section configured to generate first to sixth shifting signals which are sequentially enabled according to the programming enable signal and a clock signal; and
a buffer section configured to buffer the programming enable signal, the first to seventh addresses and the first to fourth parity signals in response to clock signal and the first to sixth shifting signals, and generate the first to twelfth pulses.

16. The fuse circuit according to claim 14, wherein the preliminary fuse unit includes first to twelfth preliminary fuse sections which respectively include fuses that are configured to generate first to twelfth programming fuse signals in response to the first to twelfth pulses.

17. The fuse circuit according to claim 16, wherein the corrected pulse generation block comprises:
an information signal generation unit configured to generate first to fourth information signals which include information regarding an error included in the first to twelfth programming fuse signals;
a correction signal generation unit configured to generate first to eighth correction signals in response to the first to fourth information signals; and
a correction unit configured to correct the error included in the first to twelfth programming fuse signals in response to the first to eighth correction signals, and generate first to eighth corrected pulses.

18. The fuse circuit according to claim 17, wherein the information signal generation unit generates,
the first information signal, a logic level of which is determined according to the first, second, fourth, fifth, seventh and ninth programming fuse signals,
the second information signal, a logic level of which is determined according to the first, third, fourth, sixth, seventh and tenth programming fuse signals,
the third information signal, a logic level of which is determined according to the second, third, fourth, eighth and eleventh programming fuse signals, and
the fourth information signal, a logic level of which is determined according to the fifth, sixth, seventh, eighth and twelfth programming fuse signals.

19. The fuse circuit according to claim 18, wherein the correction signal generation unit decodes the first to fourth information signals and generates the first to eighth correction signals.

20. The fuse circuit according to claim 19, wherein the correction unit buffers or inversion-buffers the first to eighth programming fuse signals in response to the first to eighth correction signals and transfers the first to eighth corrected pulses.

* * * * *